(12) United States Patent
Yin et al.

(10) Patent No.: US 12,256,167 B2
(45) Date of Patent: Mar. 18, 2025

(54) IMAGE SENSOR AND IMAGE SENSING METHOD

(71) Applicant: Guangzhou Tyrafos Semiconductor Technologies Co., LTD, Guangzhou (CN)

(72) Inventors: Ping-Hung Yin, Taipei (TW); Jia-Shyang Wang, Miaoli County (TW); Dean Wang, Taichung (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 231 days.

(21) Appl. No.: 18/302,818

(22) Filed: Apr. 19, 2023

(65) Prior Publication Data

US 2023/0370743 A1 Nov. 16, 2023

Related U.S. Application Data

(60) Provisional application No. 63/341,423, filed on May 13, 2022.

(51) Int. Cl.
*H04N 25/627* (2023.01)
*G06F 1/08* (2006.01)
*H01L 25/075* (2006.01)
*H01L 25/18* (2023.01)
*H03K 19/0185* (2006.01)
*H03L 7/099* (2006.01)
*H04N 25/60* (2023.01)
*H04N 25/63* (2023.01)
*H04N 25/709* (2023.01)

(Continued)

(52) U.S. Cl.
CPC ............... *H04N 25/78* (2023.01); *G06F 1/08* (2013.01); *H01L 25/0753* (2013.01); *H01L 25/18* (2013.01); *H03K 19/018521* (2013.01); *H03L 7/099* (2013.01); *H04N 25/60* (2023.01); *H04N 25/627* (2023.01); *H04N 25/63* (2023.01); *H04N 25/709* (2023.01); *H04N 25/77* (2023.01); *H04N 25/772* (2023.01); *H04N 25/778* (2023.01); *H04N 25/7795* (2023.01); *H10F 39/026* (2025.01); *H10F 39/8037* (2025.01); *H10F 39/811* (2025.01)

(58) Field of Classification Search
CPC ..................................... H04N 25/627
USPC .......................................... 348/294
See application file for complete search history.

(56) References Cited

U.S. PATENT DOCUMENTS

2018/0352183 A1* 12/2018 Yin .................. H04N 25/70

\* cited by examiner

*Primary Examiner* — Anthony J Daniels
(74) *Attorney, Agent, or Firm* — JCIPRNET

(57) ABSTRACT

An image sensor and an image sensing method are provided. The image sensor includes a first pixel circuit, a second pixel circuit, a ramp signal generating circuit, a comparator, and a signal processing circuit. The first pixel circuit has a first floating diffusion node. The second pixel circuit has a second floating diffusion node. The ramp signal generating circuit respectively provides a first ramp signal and a second ramp signal to the first floating diffusion node and the second floating diffusion node during a dark sun detection period. The comparator receives a first node voltage of the first floating diffusion node and a second node voltage of the second floating diffusion node. The signal processing circuit determines whether to output an output signal and deter- (Continued)

mines whether to overwrite a digital value corresponding to a sensing signal according to whether the comparator is triggered.

20 Claims, 6 Drawing Sheets

(51) Int. Cl.
    *H04N 25/76*     (2023.01)
    *H04N 25/77*     (2023.01)
    *H04N 25/772*     (2023.01)
    *H04N 25/778*     (2023.01)
    *H04N 25/78*     (2023.01)
    *H10F 39/00*     (2025.01)

IMAGE SENSOR AND IMAGE SENSING METHOD

CROSS-REFERENCE TO RELATED APPLICATION

This application claims the priority benefit of U.S. provisional application Ser. No. 63/341,423, filed on May 13, 2022. The entirety of the above-mentioned patent application is hereby incorporated by reference herein and made a part of this specification.

BACKGROUND

Technical Field

The disclosure relates to a sensor, and in particular to an image sensor and an image sensing method.

Description of Related Art

During the sensing process of the image sensor, if there is strong light irradiating the image sensor or when the image sensor is used to sense strong light, the image sensor may have a dark sun effect. In this regard, in the case where transfer transistors of some pixels in a pixel array of the image sensor are not turned on, floating diffusion nodes thereof may be discharged, which causes subsequent reading errors. For example, an area of an image generated by the image sensor that would otherwise be extremely bright will be darkened.

SUMMARY

The disclosure provides an image sensor and an image sensing method, which can effectively solve the dark sun effect of the image sensor.

An image sensor of the disclosure includes a first pixel circuit, a second pixel circuit, a ramp signal generating circuit, a comparator, and a signal processing circuit. The first pixel circuit has a first floating diffusion node. The second pixel circuit has a second floating diffusion node. The ramp signal generating circuit is coupled to the first floating diffusion node of the first pixel circuit and the second floating diffusion node of the second pixel circuit. The comparator is coupled to the first pixel circuit and the second pixel circuit. The signal processing circuit is coupled to the comparator. The ramp signal generating circuit respectively provides a first ramp signal and a second ramp signal to the first floating diffusion node of the first pixel circuit and the second floating diffusion node of the second pixel circuit through a first ramp capacitor and a second ramp capacitor during a normal readout period. The comparator receives a first node voltage of the first floating diffusion node and a second node voltage of the second floating diffusion node. The signal processing circuit determines whether to output a first output signal and determines whether to generate a digital value corresponding to a sensing signal according to whether the comparator is triggered. The ramp signal generating circuit respectively provides the first ramp signal and the second ramp signal to the first floating diffusion node of the first pixel circuit and the second floating diffusion node of the second pixel circuit through the first ramp capacitor and the second ramp capacitor during a dark sun detection period after the normal readout period. The comparator receives another first node voltage of the first floating diffusion node and another second node voltage of the second floating diffusion node. The signal processing circuit determines whether to output a second output signal and determines whether to overwrite the digital value corresponding to the sensing signal according to whether the comparator is triggered.

An image sensing method of the disclosure includes the following steps. A first ramp signal and a second ramp signal are respectively provided to a first floating diffusion node of a first pixel circuit and a second floating diffusion node of a second pixel circuit through a first ramp capacitor and a second ramp capacitor by a ramp signal generating circuit during a normal readout period. A first node voltage of the first floating diffusion node and a second node voltage of the second floating diffusion node are received by a comparator. Whether to output a first output signal and whether to generate a digital value corresponding to a sensing signal are determined by the signal processing circuit according to whether the comparator is triggered. The first ramp signal and the second ramp signal are respectively provided to the first floating diffusion node of the first pixel circuit and the second floating diffusion node of the second pixel circuit through the first ramp capacitor and the second ramp capacitor by the ramp signal generating circuit during a dark sun detection period after the normal readout period. Another first node voltage of the first floating diffusion node and another second node voltage of the second floating diffusion node are received by the comparator. Whether to output a second output signal and whether to overwrite the digital value corresponding to the sensing signal are determined by the signal processing circuit according to whether the comparator is triggered.

Based on the above, the image sensor and the image sensing method of the disclosure can automatically judge whether the floating diffusion node has the dark sun effect to correct the sensing signal.

In order for the features and advantages of the disclosure to be more comprehensible, the following specific embodiments are described in detail in conjunction with the drawings.

DETAILED DESCRIPTION OF DISCLOSED EMBODIMENTS

Figure 1:
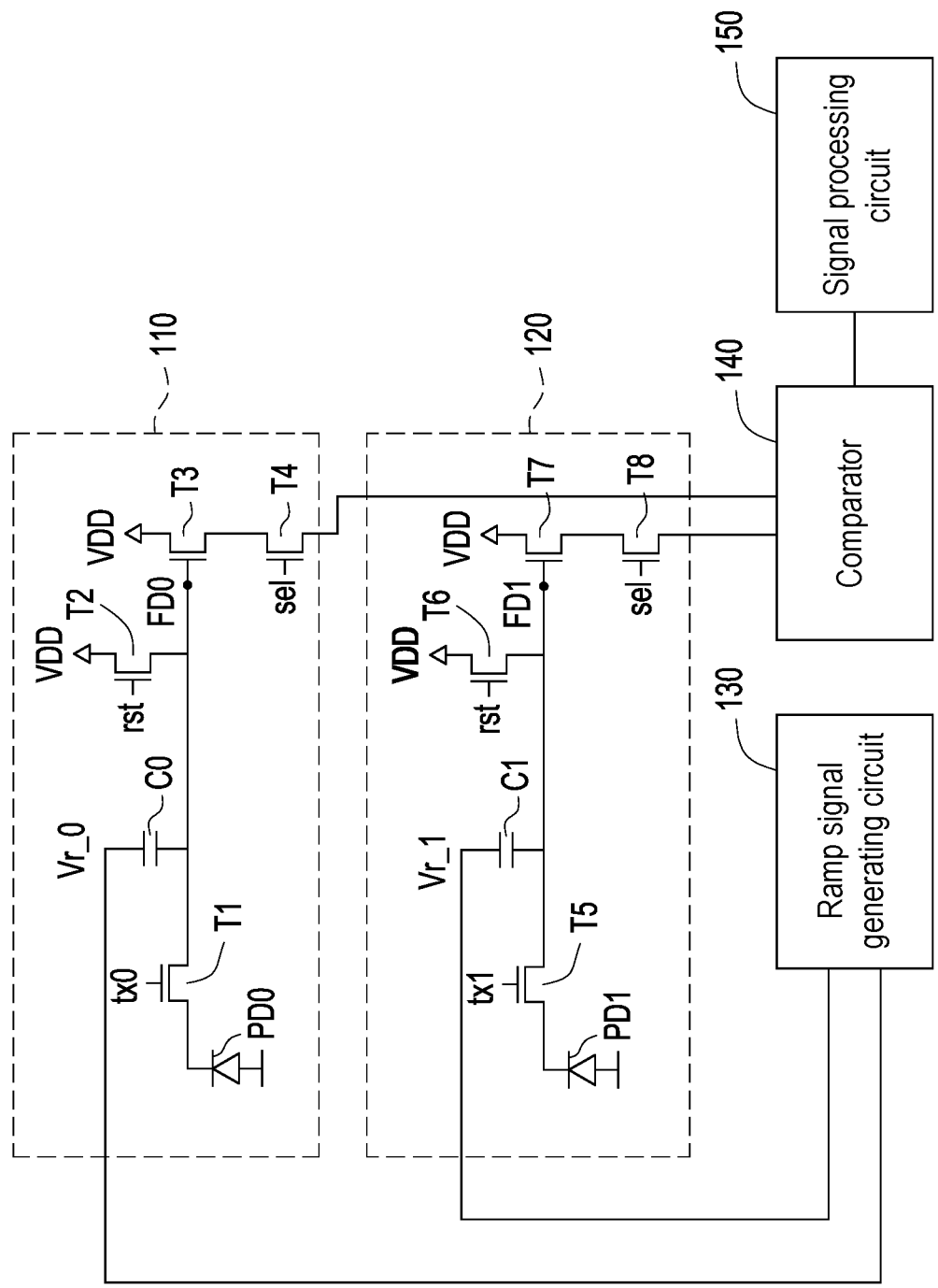
FIG. 1 is a schematic circuit diagram of an image sensor according to an embodiment of the disclosure.

In order for the content of the disclosure to be more comprehensible, the following specific embodiments are given as examples according to which the disclosure can indeed be implemented. In addition, wherever possible, elements/components/steps using the same reference numerals in the drawings and the embodiments represent the same or similar parts.

FIG. 1 is a schematic circuit diagram of an image sensor according to an embodiment of the disclosure. Referring to FIG. 1, an image sensor 100 includes a first pixel circuit 110, a second pixel circuit 120, a ramp signal generating circuit 130, a comparator 140, and a signal processing circuit 150. The first pixel circuit 110 and the second pixel circuit 120 are coupled to the ramp signal generating circuit 130 and the comparator 140. The comparator 140 is also coupled to the signal processing circuit 150. In the embodiment, the image sensor 100 may be a CMOS image sensor (CIS) and may be an active pixel sensor (APS). The image sensor 100 may include a pixel array, and the pixel array may include multiple pixel groups, wherein each pixel group may include, for example, the first pixel circuit 110 and the second pixel circuit 120. The pixel array may be disposed in an active area (AA) of the image sensor 100. The ramp signal generating circuit 130, the comparator 140, and the signal processing circuit 150 may be disposed in a peripheral area of the image sensor 100.

In the embodiment, the first pixel circuit 110 includes a sensing unit PD0, a transfer transistor T1, a reset transistor T2, a readout transistor T3, a selection transistor T4, and a ramp capacitor C0. The sensing unit PD0 may be a photodiode. A first terminal of the transfer transistor T1 is coupled to a terminal of the sensing unit PD0. The other terminal of the sensing unit PD0 is coupled to a reference voltage (for example, a ground voltage). A second terminal of the transfer transistor T1 is coupled to a floating diffusion node FD0. The transfer transistor T1 is coupled between the sensing unit PD0 and the floating diffusion node FD0. A control terminal of the transfer transistor T1 receives a first transfer signal tx0. A first terminal of the reset transistor T2 is coupled to an operating voltage VDD. A second terminal of the reset transistor T2 is coupled to the floating diffusion node FD0. A control terminal of the reset transistor T2 receives a reset signal rst. A first terminal of the readout transistor T3 is coupled to the operating voltage VDD. A second terminal of the readout transistor T3 is coupled to a first terminal of the selection transistor T4. A control terminal of the readout transistor T3 is coupled to the floating diffusion node FD0. A second terminal of the selection transistor T4 is coupled to the comparator 140. A control terminal of the selection transistor T4 receives a selection signal sel. A terminal of the ramp capacitor C0 is coupled to the ramp signal generating circuit 130 and receives a first ramp signal Vr_0. The other terminal of the ramp capacitor C0 is coupled to the floating diffusion node FD0.

In the embodiment, the second pixel circuit 120 includes a sensing unit PD1, a transfer transistor T5, a reset transistor T6, a readout transistor T7, a selection transistor T8, and a ramp capacitor C1. The sensing unit PD1 may be a photodiode. A first terminal of the transfer transistor T5 is coupled to a terminal of the sensing unit PD1. The other terminal of the sensing unit PD1 is coupled to a reference voltage (for example, a ground voltage). A second terminal of the transfer transistor T5 is coupled to a floating diffusion node FD1. The transfer transistor T5 is coupled between the sensing unit PD1 and the floating diffusion node FD1. A control terminal of the transfer transistor T5 receives a second transfer signal tx1. A first terminal of the reset transistor T6 is coupled to the operating voltage VDD. A second terminal of the reset transistor T6 is coupled to the floating diffusion node FD1. A control terminal of the reset transistor T6 receives the reset signal rst. A first terminal of the readout transistor T7 is coupled to the operating voltage VDD. A second terminal of the readout transistor T7 is coupled to a first terminal of the selection transistor T8. A control terminal of the readout transistor T7 is coupled to the floating diffusion node FD1. A second terminal of the selection transistor T8 is coupled to the comparator 140. A control terminal of the selection transistor T8 receives the selection signal sel. A terminal of the ramp capacitor C1 is coupled to the ramp signal generating circuit 130 and receives a second ramp signal Vr_1. The other terminal of the ramp capacitor C1 is coupled to the floating diffusion node FD1.

In the embodiment, the transfer transistor T1, the reset transistor T2, the readout transistor T3, the selection transistor T4, the transfer transistor T5, the reset transistor T6, the readout transistor T7, and the selection transistor T8 may respectively be N-type transistors, but the disclosure is not limited thereto. In the embodiment, the comparator 140 may be a differential amplifier. In the embodiment, the first pixel circuit 110, the second pixel circuit 120, the ramp signal generating circuit 130, the comparator 140, and the signal processing circuit 150 may form a differential digital correlated double sampling circuit.

Figure 2:
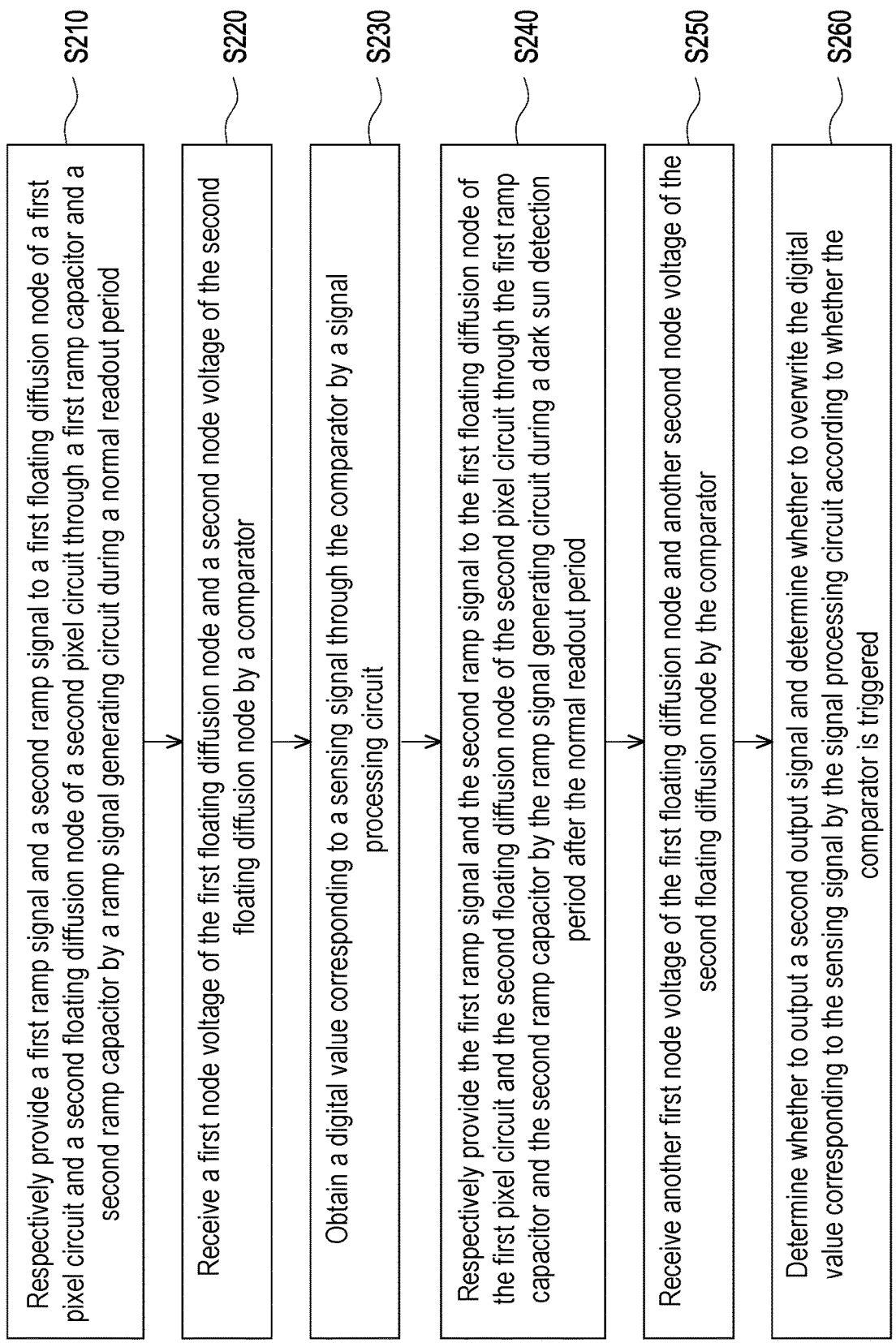
FIG. 2 is a flowchart of an image sensing method according to an embodiment of the disclosure.

FIG. 2 is a flowchart of an image sensing method according to an embodiment of the disclosure. Referring to FIG. 1 and FIG. 2, the image sensor 100 may execute, for example, Steps S210 to S260 below.

In Step S210, the ramp signal generating circuit 130 respectively provides the first ramp signal Vr_0 and the second ramp signal Vr_1 to the first floating diffusion node FD0 of the first pixel circuit 110 and the second floating diffusion node FD1 of the second pixel circuit 120 through the first ramp capacitor C0 and the second ramp capacitor C1 during a normal readout period. In the embodiment, the first ramp signal Vr_0 and the second ramp signal Vr_1 are a pair of up and down ramp signals. In an embodiment, the first ramp signal Vr_0 and the second ramp signal Vr_1 may be alternately switched to an up ramp signal and a down ramp signal. For example, during the normal readout period, the first ramp signal Vr_0 may be the up ramp signal and the second ramp signal Vr_1 may be the down ramp signal. During an operation period of a next normal readout period, the first ramp signal Vr_0 may be the down ramp signal and the second ramp signal Vr_1 may be the up ramp signal.

In Step S220, the comparator 140 may receive a first node voltage of the first floating diffusion node FD0 and a second node voltage of the second floating diffusion node FD1. In the embodiment, the readout transistor T3 of the first pixel circuit 110 may be operated as a source follower to read out the first node voltage of the first floating diffusion node FD0 to a first input terminal of the comparator 140 in cooperation with the turned-on selection transistor T4. The readout transistor T7 of the second pixel circuit 120 may be operated as a source follower to read out the second node voltage of the second floating diffusion node FD1 to a second input terminal of the comparator 140 in cooperation with the turned-on selection transistor T5. In Step S230, the signal processing circuit 150 may obtain a digital value corresponding to a sensing signal through the comparator 130.

In Step S240, the ramp signal generating circuit 130 may respectively provide the first ramp signal Vr_0 and the second ramp signal Vr_1 to the first floating diffusion node FD0 of the first pixel circuit 110 and the second floating diffusion node FD1 of the second pixel circuit 120 through the first ramp capacitor C0 and the second ramp capacitor C1 during a dark sun detection period. For example, during an operation period of the dark sun detection period, the first ramp signal Vr_0 may be the up ramp signal and the second ramp signal Vr_1 may be the down ramp signal. During an operation period of a next dark sun detection period, the first ramp signal Vr_0 may be the down ramp signal and the second ramp signal Vr_1 may be the up ramp signal.

In Step S250, the comparator 140 may receive another first node voltage of the first floating diffusion node FD0 and another second node voltage of the second floating diffusion node FD1. In the embodiment, the readout transistor T3 of the first pixel circuit 110 may be operated as a source follower to read out the another first node voltage of the first floating diffusion node FD0 to the first input terminal of the comparator 140 in cooperation with the turned-on selection transistor T4. The readout transistor T7 of the second pixel circuit 120 may be operated as a source follower to read out the another second node voltage of the second floating diffusion node FD1 to the second input terminal of the comparator 140 in cooperation with the turned-on selection transistor T5.

In Step S260, the signal processing circuit 150 may determine whether to output an output signal and determine whether to overwrite the digital value corresponding to the sensing signal according to whether the comparator 140 is triggered. In the embodiment, the signal processing circuit 150 may overwrite the digital value corresponding to the sensing signal to the highest digital value corresponding to the maximum brightness. In other words, during the dark sun detection period, the image sensor 100 may apply the ramp signals to the first floating diffusion node FD0 of the first pixel circuit 110 and the second floating diffusion node FD1 of the second pixel circuit 120, and judge whether the first floating diffusion node FD0 and/or the second floating diffusion node FD1 have a dark sun effect using the comparator 130 according to the first node voltage of the first floating diffusion node FD0 and the second node voltage of the second floating diffusion node FD1, so as to automatically correct the digital value (pixel value) of the corresponding pixel in the sensing signal. It should be noted that the digital value of the pixel is originally determined by differential output results of the first pixel circuit 110 and the second pixel circuit 120. The signal processing circuit 150 may directly modify the pixel value of the pixel having the dark sun effect due to irradiation by strong light (for example, the sun at noon or laser light) in a sensing image to the highest digital value of the maximum brightness, so as to effectively correct the sensing image.

Figure 3:
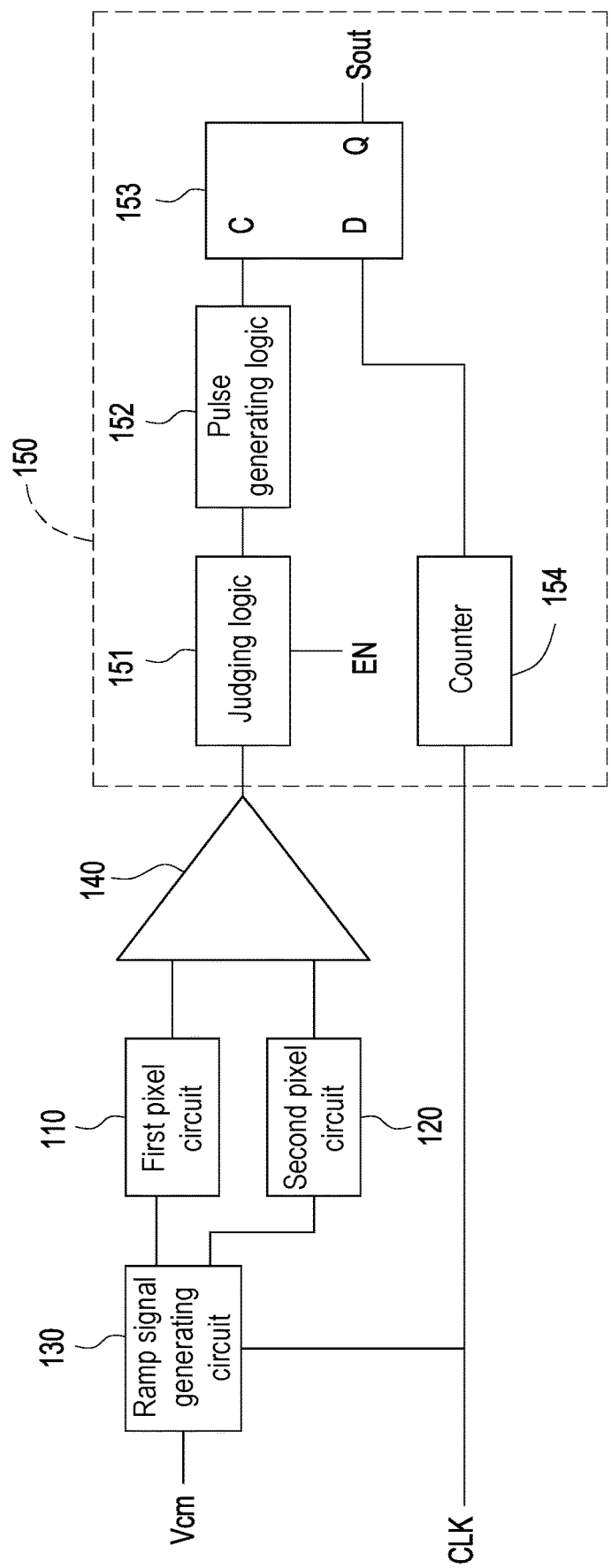
FIG. 3 is a detailed schematic circuit diagram of the image sensor according to the embodiment of FIG. 1 of the disclosure.
Figure 4:
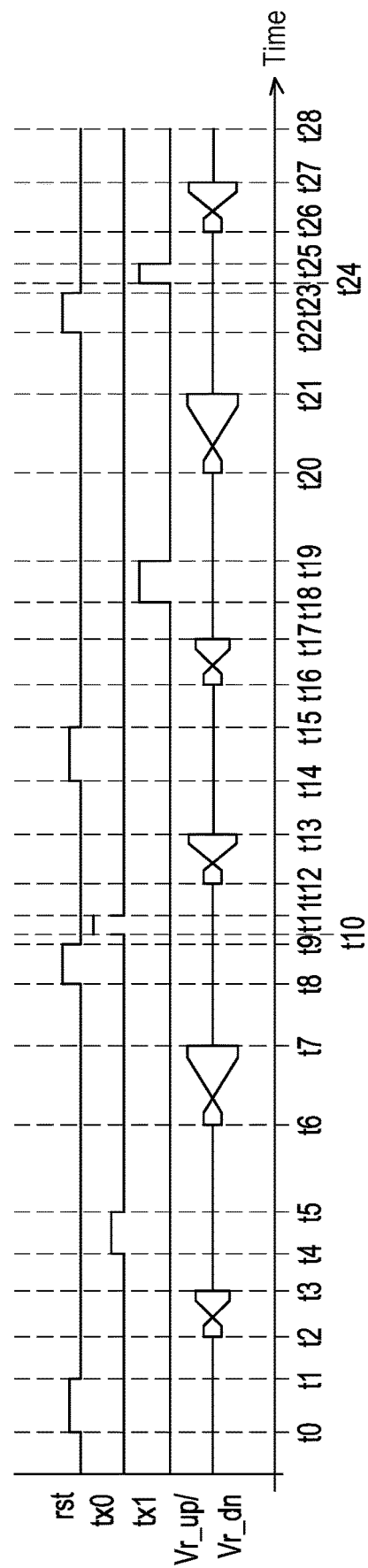
FIG. 4 is a signal waveform diagram of multiple signals according to an embodiment of the disclosure.

FIG. 3 is a detailed schematic circuit diagram of the image sensor according to the embodiment of FIG. 1 of the disclosure. FIG. 4 is a signal waveform diagram of multiple signals according to an embodiment of the disclosure. Referring to FIG. 1 and FIG. 3, in the embodiment, the signal processing circuit 150 includes a judging logic 151, a pulse generating logic 152, a latch circuit 153, and a counter 154. In the embodiment, the ramp signal generating circuit 130 may receive a reference voltage Vcm and a timing signal CLK, and generate the first ramp signal Vr_0 and the second ramp signal Vr_1 to the first pixel circuit 110 and the second pixel circuit 120 according to the reference voltage Vcm and the timing signal CLK. In the embodiment, the first pixel circuit 110 and the second pixel circuit 120 are respectively coupled to the first input terminal and the second input terminal of the comparator 140. An output terminal of the comparator 140 is coupled to the judging logic 151. The judging logic 151 receives a readout enabling signal EN. The pulse generating logic 152 is coupled to the judging logic 151 and a control terminal (C) of the latch circuit 153. The counter 154 receives the timing signal CLK and is coupled to a data input terminal (D) of the latch circuit 153. The counter 154 may count according to the timing signal CLK, and output a count value to the latch circuit 153. A data output terminal (Q) of the latch circuit 153 outputs a count value Sout. In the embodiment, the judging logic 151 determines whether to output a control signal to the pulse generating logic 152 according to whether an output signal is received, so that the pulse generating logic 152 outputs a pulse signal to the latch circuit 153, and the latch circuit 153 outputs the count value Sout. The signal processing circuit 150 may judge whether the floating diffusion node FD0 and the floating diffusion node FD1 of the first pixel circuit 110 and the second pixel circuit 120 have the dark sun effect (that is, the judging logic 151 judges whether to generate the output signal according to whether the comparator 140 is triggered) through the judging logic 151 to overwrite the (original) digital value corresponding to the sensing signal according to the (new) count value Sout.

Referring to FIG. 1, FIG. 3, and FIG. 4, during a period from time t0 to time t8, the image sensor 100 operates in the normal readout period. During a period from time t0 to time t1, the reset signal rst is switched to a high voltage level, and the first transfer signal tx0 and the second transfer signal tx1 are at low voltage levels to turn on the reset transistor T2 and the reset transistor T6, and reset the first node voltage of the first floating diffusion node FD0 and the second node voltage of the second floating diffusion node FD1 through the operating voltage VDD. The first pixel circuit 110 and the second pixel circuit 120 respectively reset the voltages of the respective sensing units PD0 and PD1, and then perform exposure. During a period from time t2 to time t3, the reset signal rst, the first transfer signal tx0, and the second transfer signal tx1 are at low voltage levels, and the ramp signal generating circuit 130 may respectively provide the first ramp signal Vr_0 with an up ramp waveform and the second ramp signal Vr_1 with a down ramp waveform to the first floating diffusion node FD0 and the second floating diffusion node FD1 through the ramp capacitor C0 and the ramp capacitor C1, so that the comparator 140 may respectively read out a first background noise signal and a second background noise signal from the readout transistor T3 and the readout transistor T7. The comparator 140 may differentially output a reference noise signal. The signal processing circuit 150 may obtain a digital value corresponding to the reference noise signal through the comparator 140.

During a period from time t4 to time t5, the first transfer signal tx0 is at a high voltage level, and the reset signal rst and the second transfer signal tx1 are at low voltage levels to turn on the transfer transistor T1, so that a sensing result of the first sensing unit PD0 is transmitted to the first floating diffusion node FD0. During a period from time t6 to time t7, the reset signal rst, the first transfer signal tx0, and the second transfer signal tx1 are at low voltage levels, and the ramp signal generating circuit 130 may respectively provide the first ramp signal Vr_0 with another up ramp waveform and the second ramp signal Vr_1 with another down ramp waveform to the first floating diffusion node FD0 and the second floating diffusion node FD1 through the ramp capacitor C0 and the ramp capacitor C1, so that the comparator 140 may respectively read out a first readout signal (including the first background noise and the sensing result of the first sensing unit PD0) and a second readout signal (including the second background noise) from the readout transistor T3 and the readout transistor T7. The comparator 140 may differentially output a reference sensing signal. The signal processing circuit 150 may obtain a digital value corresponding to the reference sensing signal through the comparator 140. In this way, the signal processing circuit 150 may subtract the digital value of the reference noise signal from the digital value of the reference sensing signal to obtain the digital value of the sensing signal without background noise.

During a period from time t8 to time t14, the image sensor 100 operates in the dark sun detection period. During the period from time t8 to time t14, the image sensor 100 detects an exposure result of the first sensing unit PD0, and judges whether the first floating diffusion node FD0 and the second floating diffusion node FD1 have the dark sun effect. During a period from time t8 to time t9, the reset signal rst is switched to a high voltage level, and the first transfer signal tx0 and the second transfer signal tx1 are at low voltage levels to turn on the reset transistor T2 and the reset transistor T6, and reset the first node voltage of the first floating diffusion node FD0 and the second node voltage of the second floating diffusion node FD1 through the operating voltage VDD. The first pixel circuit 110 and the second pixel circuit 120 respectively reset the voltages of the respective sensing units PD0 and PD1, and then perform exposure.

During a period from time t10 to time t11, the first transfer signal tx0 is at a high voltage level, and the reset signal rst and the second transfer signal tx1 are at low voltage levels to turn on the transfer transistor T1, so that the sensing result of the first sensing unit PD0 is transmitted to the first floating diffusion node FD0. During a period from time t12 to time t13, the reset signal rst, the first transfer signal tx0, and the second transfer signal tx1 are at low voltage levels, and the ramp signal generating circuit 130 may respectively provide the first ramp signal Vr_0 with another up ramp waveform and the second ramp signal Vr_1 with another down ramp waveform to the first floating diffusion node FD0 and the second floating diffusion node FD1 through the ramp capacitor C0 and the ramp capacitor C1. The first pixel circuit 110 and the second pixel circuit 120 respectively read the respective node voltages from the first floating diffusion node FD0 and the second floating diffusion node FD1 to the comparator 140. The comparator 140 may respectively receive the first node voltage of the first floating diffusion node FD0 and the second node voltage of the second floating diffusion node FD1 from the readout transistor T3 and the readout transistor T7. In the embodiment, the signal processing circuit 150 may determine whether to output the output signal and determine whether to overwrite the digital value corresponding to the sensing signal according to whether the comparator 140 is triggered.

During a period from time t14 to time t22, the image sensor 100 operates in the next normal readout period. During a period from time t14 to time t15, the reset signal rst is switched to a high voltage level, and the first transfer signal tx0 and the second transfer signal tx1 are at low voltage levels to turn on the reset transistor T2 and the reset transistor T6, and reset the first node voltage of the first floating diffusion node FD0 and the second node voltage of the second floating diffusion node FD1 through the operating voltage VDD. The first pixel circuit 110 and the second pixel circuit 120 respectively reset the voltages of the respective sensing units PD0 and PD1, and then perform exposure. During a period from time t15 to time t18, the first sensing unit PD0 and the second sensing unit PD1 may be exposed. During a period from time t16 to time t17, the reset signal rst, the first transfer signal tx0, and the second transfer signal tx1 are at low voltage levels, and the ramp signal generating circuit 130 may respectively provide the first ramp signal Vr_0 with a down ramp waveform and the second ramp signal Vr_1 with an up ramp waveform to the first floating diffusion node FD0 and the second floating diffusion node FD1 through the ramp capacitor C0 and the ramp capacitor C1, so that the comparator 140 may respectively read out the first background noise signal and the second background noise signal from the readout transistor T3 and the readout transistor T7. The comparator 140 may differentially output the reference noise signal. The signal processing circuit 150 may obtain the digital value corresponding to the reference noise signal through the comparator 140.

During a period from time t18 to time t19, the second transfer signal tx1 is at a high voltage level, and the reset signal rst and the first transfer signal tx0 are at low voltage levels to turn on the transfer transistor T1, so that the sensing result of the first sensing unit PD0 is transmitted to the first floating diffusion node FD0. During a period from time t20 to time t21, the reset signal rst, the first transfer signal tx0, and the second transfer signal tx1 are at low voltage levels, and the ramp signal generating circuit 130 may respectively provide the first ramp signal Vr_0 with another down ramp waveform and the second ramp signal Vr_1 with another up ramp waveform to the first floating diffusion node FD0 and the second floating diffusion node FD1 through the ramp capacitor C0 and the ramp capacitor C1, so that the comparator 140 may respectively read out the first readout signal (including the first background noise and the sensing result of the first sensing unit PD0) and the second readout signal (including the second background noise) from the readout transistor T3 and the readout transistor T7. The comparator 140 may differentially output the reference sensing signal. The signal processing circuit 150 may obtain the digital value corresponding to the reference sensing signal through the comparator 140. In this way, the signal processing circuit 150 may subtract the digital value of the reference noise signal from the digital value of the reference sensing signal to obtain the digital value of the sensing signal without background noise.

A period from time t22 to time t28 is a second detection period DP1 during which the image sensor 100 operates in the next dark sun detection period. During the period from time t22 to time t28, the image sensor 100 detects an exposure result of the second sensing unit PD1, and judges whether the first floating diffusion node FD0 and the second floating diffusion node FD1 have the dark sun effect. During a period from time t22 to time t23, the reset signal rst is switched to a high voltage level, and the first transfer signal tx0 and the second transfer signal tx1 are at low voltage levels to turn on the reset transistor T2 and the reset transistor T6, and reset the first node voltage of the first floating diffusion node FD0 and the second node voltage of the second floating diffusion node FD1 through the operating voltage VDD. The first pixel circuit 110 and the second pixel circuit 120 respectively reset the voltages of the respective sensing units PD0 and PD1, and then perform exposure.

During a period from time t24 to time t25, the second transfer signal tx1 is at a high voltage level, and the reset signal rst and the first transfer signal tx0 are at low voltage levels to turn on the transfer transistor T5, so that a sensing result of the second sensing unit PD1 is transmitted to the second floating diffusion node FD1. During a period from time t26 to time t27, the reset signal rst, the first transfer signal tx0, and the second transfer signal tx1 are at low voltage levels, and the ramp signal generating circuit 130 may respectively provide the first ramp signal Vr_0 with another up ramp waveform and the second ramp signal Vr_1 with another down ramp waveform to the first floating diffusion node FD0 and the second floating diffusion node FD1 through the ramp capacitor C0 and the ramp capacitor C1. The first pixel circuit 110 and the second pixel circuit 120 respectively read out the respective node voltages from the first floating diffusion node FD0 and the second floating diffusion node FD1 to the comparator 140. The comparator 140 may respectively receive the first node voltage of the first floating diffusion node FD0 and the second node voltage of the second floating diffusion node FD1 from the readout transistor T3 and the readout transistor T7. In the embodiment, the signal processing circuit 150 may determine whether to output the output signal and determine whether to overwrite the digital value corresponding to the sensing signal according to whether the comparator 140 is triggered.

It should be noted that in the embodiment, the first pixel circuit 110 and the second pixel circuit 120 perform a very short exposure operation during the dark sun detection period. In other words, the time length of the exposure performed by the first pixel circuit 110 and the second pixel circuit 120 during the dark sun detection period is shorter than the time length of the exposure performed by the first pixel circuit 110 and the second pixel circuit 120 during the normal readout period.

With reference to FIG. 5 to FIG. 8, how the signal processing circuit 150 determines whether to overwrite the digital value corresponding to the sensing signal according to an output result of the comparator 140 will be described with several exemplary embodiments.

Figure 5:
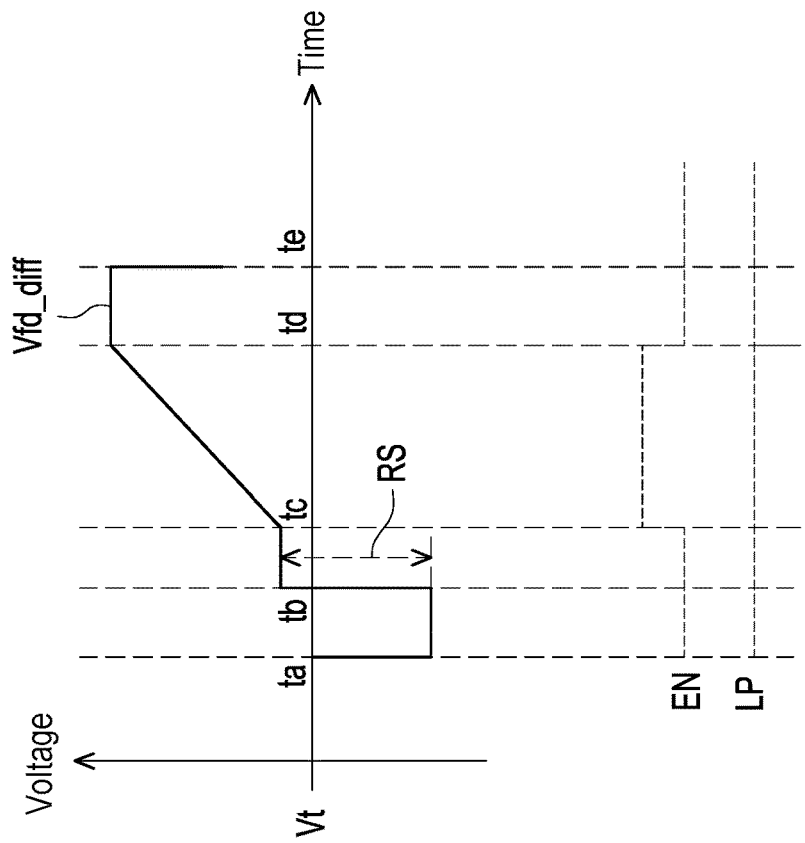
FIG. 5 is a variation graph of voltage difference between a first node voltage and a second node voltage during a detection period according to an embodiment of the disclosure.

For example, please refer to FIG. 5. FIG. 5 is a variation graph of voltage difference between a first node voltage and a second node voltage during a dark sun detection period according to an embodiment of the disclosure. A voltage difference Vfd_diff between the first node voltage of the first floating diffusion node FD0 and the second node voltage of the second floating diffusion node FD1 (a voltage value of the first node voltage minus a voltage value of the second node voltage) may be shown in FIG. 5. During a period from time ta (that is, time t10 or time t24) to time tb (that is, time t12 or time t26), since the first floating diffusion node FD0 receives the sensing result of the first sensing unit PD0 or the second floating diffusion node FD1 receives the sensing result of the second sensing unit PD1, the voltage difference Vfd_diff may be pulled down. Then, during a period from time tb to time tc, the first node voltage of the first floating diffusion node PD0 may be first changed to a first offset voltage level according to the first ramp signal Vr_0, and the second node voltage of the second floating diffusion node PD1 may be first changed to a second offset voltage level according to the second ramp signal Vr_1. In this way, the voltage difference Vfd_diff may be pulled up (an offset voltage level RS caused by the pair of up and down ramp signals is increased) and exceed a comparator trigger voltage Vt (because the first floating diffusion node FD0 and the second floating diffusion node FD1 do not have the dark sun effect). Next, during a period from time tc to time td, the judging logic 151 receives the readout enabling signal EN switched to a high voltage level for judgment. In addition, since the first floating diffusion node FD0 receives the first ramp signal Vr_0 with an up ramp waveform or a down ramp waveform and the second floating diffusion node FD1 receives the second ramp signal Vr_1 with a down ramp waveform or an up ramp waveform, the voltage difference Vfd_diff may be gradually pulled up. In this regard, during a period from time tc to time te (that is, time t13 or time t27), since the first floating diffusion node FD0 and the second floating diffusion node FD1 do not have the dark sun effect, the voltage difference Vfd_diff does not reach (not attain) the comparator trigger voltage Vt during the process of being gradually pulled up, so the comparator 140 is not triggered to output the output signal (the comparator 140 does not change an output voltage level). In this way, the judging logic 151 does not generate the control signal to the pulse generating logic 152, and the pulse generating logic 152 also does not generate the pulse signal to the latch circuit 153. As shown in FIG. 5, a logic signal LP output by the pulse generating logic 152 is maintained at a low voltage level.

Figure 6:
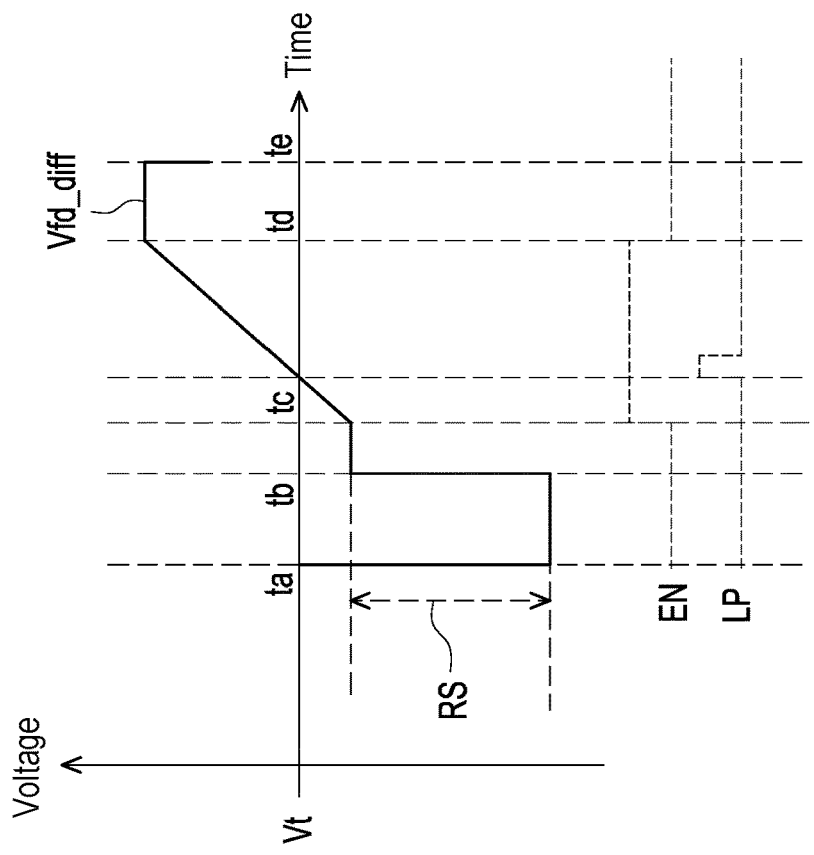
FIG. 6 is a variation graph of voltage difference between a first node voltage and a second node voltage according to another embodiment of the disclosure.

For example, please refer to FIG. 6. FIG. 6 is a variation graph of voltage difference between a first node voltage and a second node voltage according to another embodiment of the disclosure. The voltage difference Vfd_diff between the first node voltage of the first floating diffusion node FD0 and the second node voltage of the second floating diffusion node FD1 (the voltage value of the first node voltage minus the voltage value of the second node voltage) may be shown in FIG. 6. During the period from time ta (that is, time t10 or time t24) to time tb (that is, time t12 or time t26), since the first floating diffusion node FD0 receives the sensing result of the first sensing unit PD0 or the second floating diffusion node FD1 receives the sensing result of the second sensing unit PD1, and the first floating diffusion node FD0 and/or the second floating diffusion node FD1 have the dark sun effect, the voltage difference Vfd_diff may be pulled down more. Then, during the period from time tb to time tc, the first node voltage of the first floating diffusion node PD0 may be first changed to the first offset voltage level according to the first ramp signal Vr_0, and the second node voltage of the second floating diffusion node PD1 may be first changed the second offset voltage level according to the second ramp signal Vr_1. In this way, the voltage difference Vfd_diff may be pulled up (the offset voltage level RS caused by the pair of up and down ramp signals is increased) and does not exceed the comparator trigger voltage Vt (because the first floating diffusion node FD0 and/or the second floating diffusion node FD1 have the dark sun effect). Next, during the period from time tc to time td, the judging logic 151 receives the readout enabling signal EN switched to a high voltage level for judgment. In addition, since the first floating diffusion node FD0 receives the first ramp signal Vr_0 with an up ramp waveform or a down ramp waveform and the second floating diffusion node FD1 receives the second ramp signal Vr_1 with a down ramp waveform or an up ramp waveform, the voltage difference Vfd_diff may be gradually pulled up. In this regard, during the period from time tc to time te (that is, time t13 or time t27), since the first floating diffusion node FD0 and/or the second floating diffusion node FD1 have the dark sun effect, the voltage difference Vfd_diff reaches (attains) the comparator trigger voltage Vt during the process of being gradually pulled up, so the comparator 140 is triggered to output the output signal (the comparator 140 changes the output voltage level). In this way, the judging logic 151 may generate the control signal to the pulse generating logic 152, and the pulse generating logic 152 may generate the pulse signal to the latch circuit 153. As shown in FIG. 6, the logic signal LP output by the pulse generating logic 152 correspondingly generates a pulse waveform (that is, as the pulse signal). Therefore, the latch circuit 153 may output the current count value Sout provided by the counter 154 according to the pulse signal to be used to overwrite the digital value corresponding to the sensing signal.

Figures 7, 8:
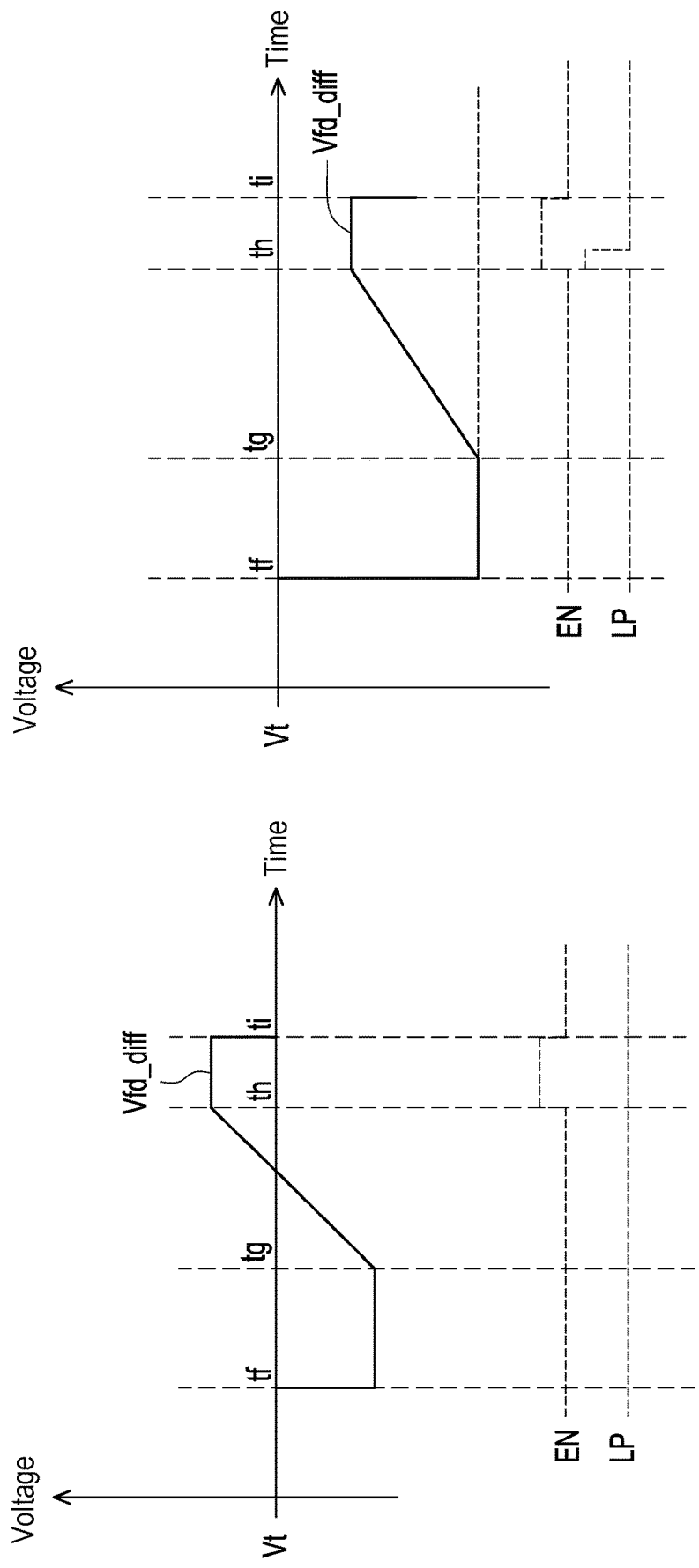
FIG. 7 is a variation graph of voltage difference between a first node voltage and a second node voltage according to another embodiment of the disclosure.
FIG. 8 is a variation graph of voltage difference between a first node voltage and a second node voltage according to another embodiment of the disclosure.

For example, please refer to FIG. 7. FIG. 7 is a variation graph of voltage difference between a first node voltage and a second node voltage according to another embodiment of the disclosure. The voltage difference Vfd_diff between the first node voltage of the first floating diffusion node FD0 and the second node voltage of the second floating diffusion node FD1 (the voltage value of the first node voltage minus the voltage value of the second node voltage) may be shown in FIG. 7. During a period from time tf (that is, time t10 or time t24) to time tg (that is, time t12 or time t26), since the first floating diffusion node FD0 receives the sensing result of the first sensing unit PD0 or the second floating diffusion node FD1 receives the sensing result of the second sensing unit PD1, the voltage difference Vfd_diff may be pulled down. Next, during a period from time tg to time th, since the first floating diffusion node FD0 receives the first ramp signal Vr_0 with an up ramp waveform or a down ramp waveform and the second floating diffusion node FD1 receives the second ramp signal Vr_1 with a down ramp waveform or an up ramp waveform, the voltage difference Vfd_diff may be gradually pulled up. During a period from time th to time ti (that is, time t13 or time t27), the judging logic 151 receives the readout enabling signal EN switched to a high voltage level for judgment. In this regard, since the first floating diffusion node FD0 and the second floating diffusion node FD1 do not have the dark sun effect, the voltage difference Vfd_diff exceeds the comparator trigger voltage Vt during the process of being gradually pulled up, so the comparator 140 is triggered to output the output signal (the comparator 140 changes the output voltage level). In this way, the judging logic 151 does not generate the control signal to the pulse generating logic 152, and the pulse generating logic 152 also does not generate the pulse signal to the latch circuit 153. As shown in FIG. 7, the logic signal LP output by the pulse generating logic 152 is maintained at a low voltage level.

For example, please refer to FIG. 8. FIG. 8 is a variation graph of voltage difference between a first node voltage and a second node voltage according to another embodiment of the disclosure. The voltage difference Vfd_diff between the first node voltage of the first floating diffusion node FD0 and the second node voltage of the second floating diffusion node FD1 (the voltage value of the first node voltage minus the voltage value of the second node voltage) may be shown in FIG. 8. During the period from time tf (that is, time t10 or time t24) to time tg (that is, time t12 or time t26), since the first floating diffusion node FD0 receives the sensing result of the first sensing unit PD0 or the second floating diffusion node FD1 receives the sensing result of the second sensing unit PD1, and the first floating diffusion node FD0 and/or the second floating diffusion node FD1 have the dark sun effect, the voltage difference Vfd_diff may be pulled down more. Next, during the period from time tg to time th, since the first floating diffusion node FD0 receives the first ramp signal Vr_0 with an up ramp waveform or a down ramp waveform and the second floating diffusion node FD1 receives the second ramp signal Vr_1 with a down ramp waveform or an up ramp waveform, the voltage difference Vfd_diff may be gradually pulled up. During the period from time th to time ti (that is, time t13 or time t27), the judging logic 151 receives the readout enabling signal EN switched to a high voltage level for judgment. In this regard, since the first floating diffusion node FD0 and/or the second floating diffusion node FD1 have the dark sun effect, the voltage difference Vfd_diff does not exceed the comparator trigger voltage Vt during the process of being gradually pulled up, so the comparator 140 is not triggered to output the output signal (the comparator 140 changes the output voltage level). In this way, the judging logic 151 generates the control signal to the pulse generating logic 152, and the pulse generating logic 152 generates the pulse signal to the latch circuit 153. As shown in FIG. 8, the logic signal LP output by the pulse generating logic 152 correspondingly generates the pulse waveform (that is, as the pulse signal). Therefore, the latch circuit 153 may output the current count value Sout provided by the counter 154 according to the pulse signal to be used to overwrite the digital value corresponding to the sensing signal.

In summary, the image sensor and the image sensing method of the disclosure may detect whether the first floating diffusion node and the second floating diffusion node of the first pixel circuit and the second pixel circuit have the dark sun effect through applying the ramp signals to the first floating diffusion node and the second floating diffusion node of the first pixel circuit and the second pixel circuit for differential output, and may automatically correct the sensing signal, so that the sensing image generated by the image sensor can have the correct pixel values.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. An image sensor, comprising:
   a first pixel circuit, having a first floating diffusion node;
   a second pixel circuit, having a second floating diffusion node;
   a ramp signal generating circuit, coupled to the first pixel circuit and the second pixel circuit;
   a comparator, coupled to the first pixel circuit and the second pixel circuit; and
   a signal processing circuit, coupled to the comparator,
   wherein the ramp signal generating circuit respectively provides a first ramp signal and a second ramp signal to the first floating diffusion node of the first pixel circuit and the second floating diffusion node of the second pixel circuit through a first ramp capacitor and a second ramp capacitor during a normal readout period, the comparator receives a first node voltage of the first floating diffusion node and a second node voltage of the second floating diffusion node, and the signal processing circuit obtains a digital value corresponding to a sensing signal through the comparator,
   wherein the ramp signal generating circuit respectively provides the first ramp signal and the second ramp signal to the first floating diffusion node of the first pixel circuit and the second floating diffusion node of the second pixel circuit through the first ramp capacitor and the second ramp capacitor during a dark sun detection period after the normal readout period, the comparator receives another first node voltage of the first floating diffusion node and another second node voltage of the second floating diffusion node, and the signal processing circuit determines whether to output a second output signal and determines whether to overwrite the digital value corresponding to the sensing signal according to whether the comparator is triggered.

2. The image sensor according to claim 1, wherein during the dark sun detection period, the first pixel circuit and the second pixel circuit respectively reset voltages of respective sensing units and perform exposure, so that the first floating diffusion node and the second floating diffusion node generate the another first node voltage and the another second node voltage, wherein the first pixel circuit and the second pixel circuit respectively read out the another first node voltage and the another second node voltage from the first floating diffusion node and the second floating diffusion node to the comparator, wherein a time length of exposure performed by the first pixel circuit and the second pixel circuit during the dark sun detection period is shorter than a time length of exposure performed by the first pixel circuit and the second pixel circuit during the normal readout period.

3. The image sensor according to claim 1, wherein the signal processing circuit overwrites the digital value corresponding to the sensing signal to a highest digital value corresponding to a maximum brightness.

4. The image sensor according to claim 1, wherein the ramp signal generating circuit, the first pixel circuit, the second pixel circuit, the comparator, and the signal processing circuit form a differential digital correlated double sampling circuit.

5. The image sensor according to claim 1, wherein the another first node voltage of the first floating diffusion node is changed to a first offset voltage level according to the first ramp signal, and the another second node voltage of the second floating diffusion node is changed to a second offset voltage level according to the second ramp signal during the dark sun detection period, wherein the signal processing circuit overwrites the digital value corresponding to the sensing signal according to a maximum count value when the comparator is triggered according to the first node voltage and the second node voltage to output the second output signal during the dark sun detection period.

6. The image sensor according to claim 1, wherein the signal processing circuit overwrites the digital value corresponding to the sensing signal according to a maximum count value when the comparator is not triggered according to the first node voltage and the second node voltage and does not output the second output signal during the dark sun detection period.

7. The image sensor according to claim 1, wherein the signal processing circuit comprises:
a latch circuit;
a judging logic, coupled to the comparator and receiving a readout enabling signal;
a pulse generating logic, coupled to the judging logic and a control terminal of the latch circuit; and
a counter, coupled to a data input terminal of the latch circuit,
wherein the judging logic determines whether to output a control signal to the pulse generating logic according to whether the second output signal is received, so that the pulse generating logic outputs a pulse signal to the latch circuit, and the latch circuit outputs a count value provided by the counter to overwrite the digital value corresponding to the sensing signal.

8. The image sensor according to claim 6, wherein the pulse generating logic and the counter receive a timing signal, and the counter counts according to the timing signal.

9. The image sensor according to claim 1, wherein the first pixel circuit and the second pixel circuit respectively comprise:
a sensing unit;
a transfer transistor, coupled between the sensing unit and a floating diffusion node;
a reset transistor, coupled to the floating diffusion node;
a readout transistor, coupled to the floating diffusion node;
a selection transistor, coupled to the readout transistor; and
a ramp capacitor, coupled between the floating diffusion node and the ramp signal generating circuit.

10. The image sensor according to claim 9, wherein when detecting a first sensing unit of the first pixel circuit, the first ramp signal received by the ramp capacitor of the first pixel circuit during the dark sun detection period is an up ramp signal, and the second ramp signal received by the ramp capacitor of the second pixel circuit is a down ramp signal, and the transfer transistor of the second pixel circuit is not turned on during the dark sun detection period, wherein when detecting a second sensing unit of the second pixel circuit, the second ramp signal received by the ramp capacitor of the second pixel circuit during the dark sun detection period is the up ramp signal, the first ramp signal received by the ramp capacitor of the first pixel circuit is the down ramp signal, and the transfer transistor of the first pixel circuit is not turned on during the dark sun detection period.

11. The image sensor according to claim 1, wherein the first ramp signal and the second ramp signal are a pair of up and down ramp signals.

12. An image sensing method, comprising:
respectively providing a first ramp signal and a second ramp signal to a first floating diffusion node of a first pixel circuit and a second floating diffusion node of a second pixel circuit through a first ramp capacitor and a second ramp capacitor by a ramp signal generating circuit during a normal readout period;
receiving a first node voltage of the first floating diffusion node and a second node voltage of the second floating diffusion node by a comparator;
obtaining a digital value corresponding to a sensing signal through the comparator by a signal processing circuit;
respectively providing the first ramp signal and the second ramp signal to the first floating diffusion node of the first pixel circuit and the second floating diffusion node of the second pixel circuit through the first ramp capacitor and the second ramp capacitor by the ramp signal generating circuit during a dark sun detection period after the normal readout period;
receiving another first node voltage of the first floating diffusion node and another second node voltage of the second floating diffusion node by the comparator; and
determining whether to output a second output signal and determining whether to overwrite the digital value corresponding to the sensing signal by the signal processing circuit according to whether the comparator is triggered.

13. The image sensing method according to claim 12, wherein during the dark sun detection period, the first pixel circuit and the second pixel circuit respectively reset voltages of respective sensing units and perform exposure, so that the first floating diffusion node and the second floating diffusion node generate the another first node voltage and the another second node voltage, wherein the first pixel circuit and the second pixel circuit respectively read out the another first node voltage and the another second node voltage from the first floating diffusion node and the second floating diffusion node to the comparator, wherein a time length of exposure performed by the first pixel circuit and the second pixel circuit during the dark sun detection period is shorter than a time length of exposure performed by the first pixel circuit and the second pixel circuit during the normal readout period.

14. The image sensing method according to claim 12, wherein the ramp signal generating circuit, the first pixel circuit, the second pixel circuit, the comparator, and the signal processing circuit form a differential digital correlated double sampling circuit.

15. The image sensing method according to claim 12, wherein the signal processing circuit overwrites the digital value corresponding to the sensing signal to a highest digital value corresponding to a maximum brightness.

16. The image sensing method according to claim 12, wherein the step of determining whether to output the second output signal and determining whether to overwrite the digital value corresponding to the sensing signal by the signal processing circuit according to whether the comparator is triggered comprises:

first changing the first node voltage of the first floating diffusion node to a first offset voltage level according to the first ramp signal, and first changing the second node voltage of the second floating diffusion node to a second offset voltage level according to the second ramp signal during the dark sun detection period; and overwriting the digital value corresponding to the sensing signal by the signal processing circuit according to a maximum count value when the comparator is triggered to output the second output signal according to the first node voltage and the second node voltage during the dark sun detection period.

17. The image sensing method according to claim 12, wherein the step of determining whether to output the second output signal and determining whether to overwrite the digital value corresponding to the sensing signal by the signal processing circuit according to whether the comparator is triggered comprises:

overwriting the digital value corresponding to the sensing signal by the signal processing circuit according to a maximum count value when the comparator is not triggered according to the first node voltage and the second node voltage and does not output the second output signal during the dark sun detection period.

18. The image sensing method according to claim 12, wherein the step of determining whether to output the second output signal and determining whether to overwrite the digital value corresponding to the sensing signal by the signal processing circuit according to whether the comparator is triggered comprises:

receiving a readout enabling signal by a judging logic;

determining whether to output a control signal to a pulse generating logic according to whether the second output signal is received by the judging logic;

outputting a pulse signal to a latch circuit according to the control signal by the pulse generating logic; and outputting a count value provided by a counter according to the pulse signal by the latch circuit to overwrite the digital value corresponding to the sensing signal.

19. The image sensing method according to claim 18, wherein the step of determining whether to output the second output signal and determining whether to overwrite the digital value corresponding to the sensing signal by the signal processing circuit according to whether the comparator is triggered further comprises:

receiving a timing signal by the pulse generating logic and the counter, and counting by the counter according to the timing signal.

20. The image sensing method according to claim 12, wherein the first ramp signal and the second ramp signal are a pair of up and down ramp signals.

* * * * *